United States Patent
Chen et al.

(10) Patent No.: US 11,190,140 B2
(45) Date of Patent: Nov. 30, 2021

(54) WIDE VOLTAGE TRANS-IMPEDANCE AMPLIFIER

(71) Applicant: SOUTHEAST UNIVERSITY, Nanjing (CN)

(72) Inventors: Chao Chen, Nanjing (CN); Jun Yang, Nanjing (CN); Xinning Liu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 15 days.

(21) Appl. No.: 16/967,745

(22) PCT Filed: Apr. 30, 2020

(86) PCT No.: PCT/CN2020/087985
§ 371 (c)(1),
(2) Date: Aug. 6, 2020

(87) PCT Pub. No.: WO2020/233384
PCT Pub. Date: Nov. 26, 2020

(65) Prior Publication Data
US 2021/0320624 A1    Oct. 14, 2021

(30) Foreign Application Priority Data

May 23, 2019  (CN) .......................... 201910434745.1

(51) Int. Cl.
*H03F 1/02* (2006.01)
*H03F 1/56* (2006.01)

(52) U.S. Cl.
CPC ............. *H03F 1/0222* (2013.01); *H03F 1/56* (2013.01)

(58) Field of Classification Search
CPC ................................. H03F 1/0222; H03F 1/56
USPC ........................................................... 330/250
See application file for complete search history.

(56) References Cited

U.S. PATENT DOCUMENTS

| 5,581,212 A * | 12/1996 | Huang ................... H03F 3/345 330/253 |
| 2016/0336910 A1* | 11/2016 | Miri Lavasani .... H03F 3/45179 |
| 2017/0286347 A1* | 10/2017 | Hinderer ............. G06F 13/4282 |

FOREIGN PATENT DOCUMENTS

| CN | 102983817 A | 3/2013 |
| CN | 103023444 A | 4/2013 |
| CN | 106301240 A | 1/2017 |
| CN | 110190821 A * | 8/2019 |

(Continued)

*Primary Examiner* — Hafizur Rahman
(74) *Attorney, Agent, or Firm* — Bayramoglu Law Offices LLC

(57) ABSTRACT

A wide voltage trans-impedance amplifier includes a first P-channel metal oxide semiconductor (PMOS) transistor PM1, a second PMOS transistor PM2, a third PMOS transistor PM3, a fourth PMOS transistor PM4, a fifth PMOS transistor PM5, a first bias voltage VB1, a second bias voltage VB2, a third bias voltage VB3, a first N-channel metal oxide semiconductor (NMOS) transistor NM1, and a second NMOS transistor NM2. A common-gate amplifier detects a change of an input voltage, and a negative feedback is constructed by injecting a current into a current mirror to achieve a low input impedance. The trans-impedance amplifier uses a common-gate amplifier to monitor an input voltage and uses a current mirror to perform the transconductance enhancement on an input transistor, while ensuring a relatively high loop gain.

2 Claims, 2 Drawing Sheets

(56) References Cited

FOREIGN PATENT DOCUMENTS

| | | |
|---|---|---|
| CN | 110212867 A | 9/2019 |
| JP | 2019036839 A | 3/2019 |

\* cited by examiner

WIDE VOLTAGE TRANS-IMPEDANCE AMPLIFIER

CROSS REFERENCE TO THE RELATED APPLICATIONS

This application is the national phase entry of International Application No. PCT/CN2020/087985, filed on Apr. 30, 2020, which is based upon and claims priority to Chinese Patent Application No. 201910434745.1, filed on May 23, 2019, the entire contents of which are incorporated herein by reference.

TECHNICAL FIELD

The present invention relates to an amplifier, and more particularly, to a wide voltage trans-impedance amplifier, which belongs to the technical field of analog circuits.

BACKGROUND

As the process size of an integrated circuit continues to decrease, the power source voltage of a chip continues decreasing proportionately. Because of the limitation posed by current-leaking transistors, however, the threshold voltage of the transistor does not continue to decrease. Instead, voltage maintains at the magnitude of 350 mV-450 mV, which presents challenges to traditional analog circuit design. As an important basic module for realizing current-to-voltage conversion, a trans-impedance amplifier is widely used in a radio frequency communication circuit, a sensor circuit, and other commonly used analog circuits. The common-gate input trans-impedance amplifier based on transconductance enhancement technology has characteristics of low input impedance and high output impedance, and is widely used in conventional voltage radio frequency and analog circuits. Two gate-source voltages and one drain-source voltage, however, are stacked in the traditional structure from the power source to the ground, which is difficult to adapt to a low-voltage condition. In order to further promote the practicality of low-voltage radio frequency and analog circuits, it is desirable that a new low-voltage trans-impedance amplifier structure be proposed to overcome the bottleneck of voltage margin.

Under the above background, the present invention proposes a low-voltage trans-impedance amplifier. The new trans-impedance amplifier uses a common-gate amplifier to monitor an input voltage and uses a current mirror to perform the transconductance enhancement on an input transistor, while ensuring a relatively high loop gain. Compared with the trans-impedance amplifier of the traditional structure, the power supply voltage of the structure of the present invention drops by a magnitude of one threshold voltage and can work at a lower power source voltage. The circuit of the present invention has characteristics of wide power supply range, low minimum working voltage, low input impedance, high output impedance and others.

SUMMARY

The present invention is directed to problems in the prior art and provides a wide voltage trans-impedance amplifier. This technical solution optimizes the minimum voltage drop of two gate-source voltages plus one drain-source voltage in a conventional structure to be one gate-source voltage and two drain-source voltages, releases a margin of one threshold voltage and reduces the minimum power supply voltage by at least 200 mV.

In order to realize the above improvements, the technical solution of the present invention is as follows: a wide voltage trans-impedance amplifier includes a first P-channel metal oxide semiconductor transistor PM1, a second P-channel metal oxide semiconductor transistor PM2, a third P-channel metal oxide semiconductor transistor PM3, a fourth P-channel metal oxide semiconductor transistor PM4, a fifth P-channel metal oxide semiconductor transistor PM5, a first bias voltage VB1, a second bias voltage VB2, a third bias voltage VB3, a first N-channel metal oxide semiconductor transistor NM1 and a second N-channel metal oxide semiconductor transistor NM2. A source of the first P-channel metal oxide semiconductor transistor (hereinafter referred to as PMOS transistor) PM1 is connected to a power source voltage. A gate of the PM1 is connected to the first bias voltage VB1, and a drain of the PM1 is connected to an input terminal of the trans-impedance amplifier. A source of the second PMOS transistor PM2 is connected to the input terminal of the trans-impedance amplifier. A gate of the PM2 is connected to a drain of the fifth PMOS transistor PM5, and a drain of the PM2 is connected to an output terminal of the trans-impedance amplifier. A source of the fifth PMOS transistor PM5 is connected to the input terminal of the trans-impedance amplifier, and a gate of the PM5 is connected to the drain of the PM5. A source of the third PMOS transistor PM3 is connected to the input terminal of the trans-impedance amplifier, and a gate of the PM3 is connected to the second bias voltage VB2. A drain of the PM3 is connected to a drain of the first N-channel metal oxide semiconductor transistor (hereinafter referred to as NMOS transistor) NM1. A gate of the NM1 is connected to the third bias voltage VB3 and a source of the NM1 is grounded. A gate of the second NMOS transistor NM2 is connected to the drain of the NM1. A drain of the NM2 is connected to the drain of the PM5. A source of the NM2 is grounded. An anode of the first resistor R1 is connected to the output terminal of the trans-impedance amplifier, and a cathode of the R1 is grounded. A source of the fourth PMOS transistor PM4 is connected to the power source voltage. A gate of the PM4 is connected to the first bias voltage VB1, and a drain of the PM4 is connected to the drain of the PM5. The traditional common-gate input and transconductance enhancement trans-impedance amplifier uses a PMOS common-gate transistor as an input transistor. An input terminal of the trans-impedance amplifier is connected to a gate of an independent PMOS common-source amplifier, and a gate of the common-gate transistor is connected to an output terminal of the common-source amplifier. From a structural perspective, at least two gate-source voltages and one drain-source voltage are stacked in the traditional trans-impedance amplifier from the power source to the ground. When the power source voltage is reduced to 0.7V or below, this traditional structure will not provide each transistor with a sufficient voltage margin. The present invention makes an improvement to the classic transconductance enhancement and common-gate trans-impedance amplifier, replaces a common-source amplifier with a common-gate amplifier to realize the transconductance enhancement function and uses a current mirror to transfer a gate voltage, which is input to the common-gate transistor.

As an improvement of the present invention, a common-gate amplifier detects a change of an input voltage and a negative feedback is constructed by injecting a current into a current mirror to achieve a low input impedance. Compared with the trans-impedance amplifier of the traditional structure, the power supply voltage of the structure of the present invention drops by a magnitude of one threshold voltage and can work at a lower power source voltage.

Compared with the prior art, the present invention has the following advantages.

(1) The wide voltage trans-impedance amplifier of the invention uses a common-gate amplifier to monitor an input voltage, uses a current mirror to perform the transconductance enhancement on an input transistor and ensures a relatively high loop gain. Compared with the trans-impedance amplifier of the traditional structure, the power supply voltage of the structure of the present invention drops by a magnitude of one threshold voltage and can work at a lower power source voltage. The circuit of the present invention has characteristics of wide power supply range, low minimum working voltage, low input impedance, high output impedance and others.

(2) The technical solution of the present invention is suitable for the field of low-voltage radio frequency receivers and other low-voltage and wide-voltage analog circuits to realize current-to-voltage conversion, such as a passive mixer of a radio frequency front end, an output stage of a variable gain amplifier, a current-voltage converter in a photoelectric sensor and the like.

(3) The trans-impedance amplifier uses a common-gate amplifier to monitor an input voltage and uses a current mirror to perform the transconductance enhancement on an input transistor, while ensuring a relatively high loop gain. Compared with the trans-impedance amplifier of the traditional structure, the power supply voltage of the structure of the present invention drops by a magnitude of one threshold voltage and can work at a lower power source voltage. The circuit of the present invention has characteristics of wide power supply range, low minimum working voltage, low input impedance and high output impedance. The unique circuit structure of the present invention makes the bias state of each transistor correspond to each other and has strong resistance to process, voltage and temperature (PVT).

DETAILED DESCRIPTION OF THE EMBODIMENTS

In order to deepen the understanding of the present invention, the present embodiment is described in detail hereinafter with reference to the drawings.

Figure 1:
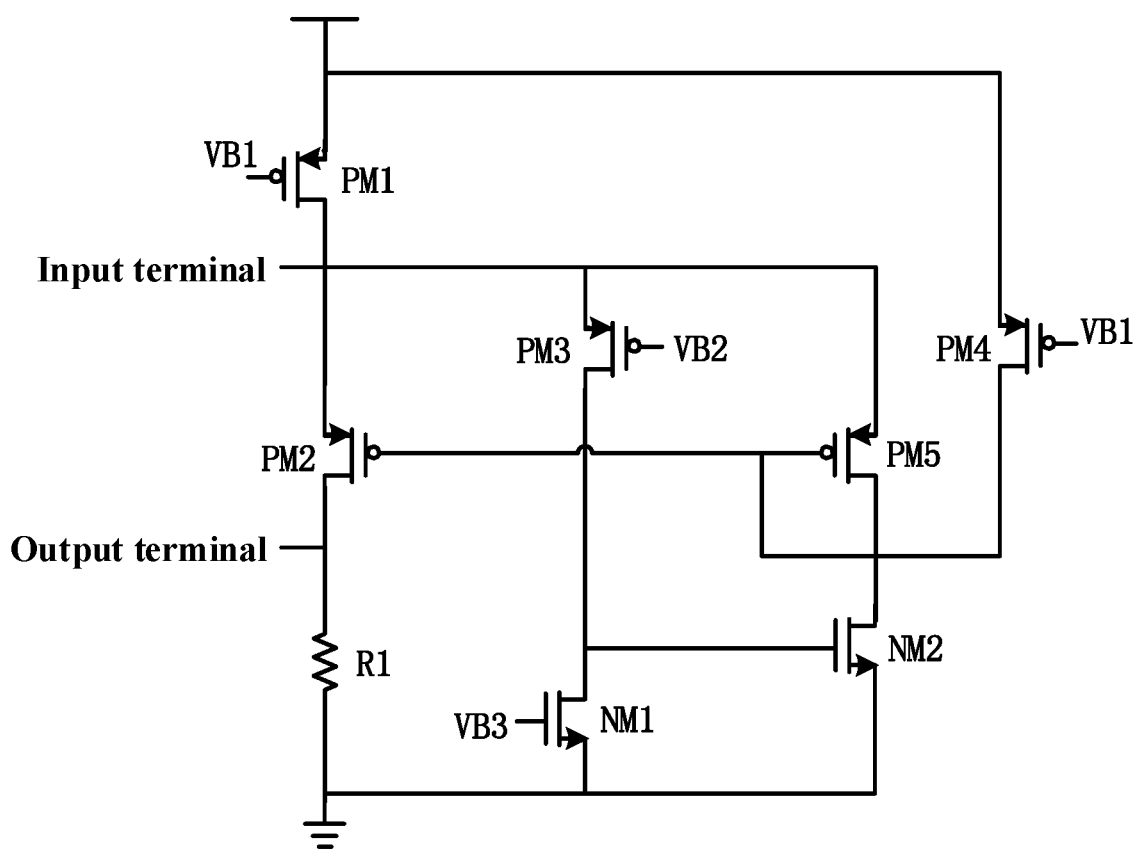
FIG. 1 is a schematic diagram showing the circuit structure of a wide voltage trans-impedance amplifier of the present invention.

Embodiment 1: As shown in FIG. 1, the wide voltage trans-impedance amplifier of the present invention uses a common-gate amplifier to monitor an input voltage and uses a current mirror to perform the transconductance enhancement on an input transistor, while ensuring a relatively high loop gain. Compared with the traditional structure, the minimum power supply voltage of the trans-impedance amplifier drops by one threshold voltage. The working principle of the circuit is analyzed as follows: an input current is input from a source of the common-gate transistor PM2 and is output to the load resistor R1 through a drain of the common-gate transistor PM2 to be converted into an output voltage. The current source PM1 is configured to solidify a bias current of the gain-enhanced amplifier. The PM3 and the NM1 form a common-gate amplifier, which is used to detect voltage fluctuation at an input terminal and perform error amplification. The amplified voltage is converted into current through the NM2 transistor and mirrored to the PM2 through the PM5 to form a transconductance enhancement effect. The independent current source PM4 shunts the PM5 to enhance the loop gain.

Figure 2:
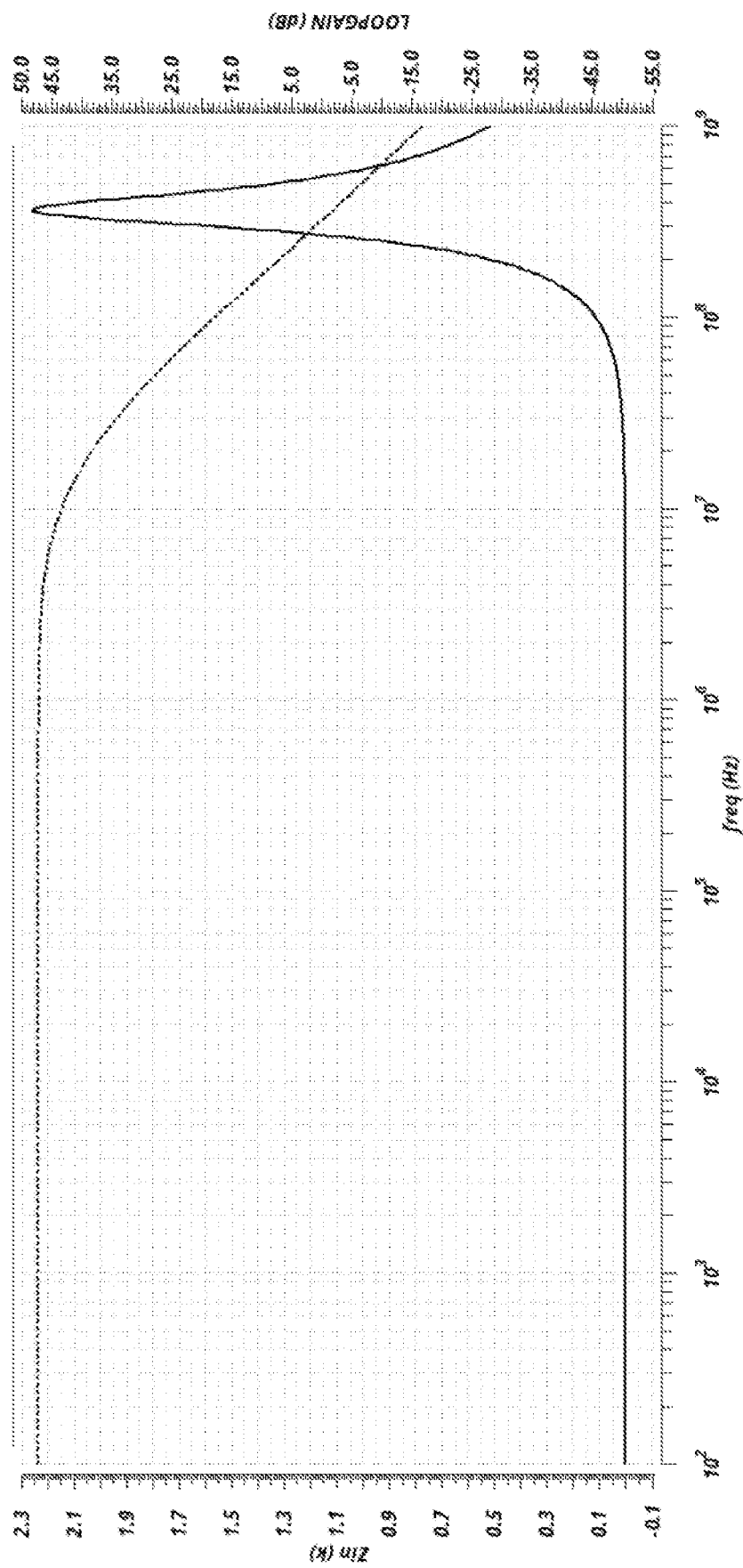
FIG. 2 is a curve graph showing that an input impedance and a loop gain of the trans-impedance amplifier vary with frequency according to the present invention.

Referring to FIGS. 1-2, a wide voltage trans-impedance amplifier includes the first P-channel metal oxide semiconductor transistor PM1, the second P-channel metal oxide semiconductor transistor PM2, the third P-channel metal oxide semiconductor transistor PM3, the fourth P-channel metal oxide semiconductor transistor PM4, the fifth P-channel metal oxide semiconductor transistor PM5, the first bias voltage VB1, the second bias voltage VB2, the third bias voltage VB3, the first N-channel metal oxide semiconductor transistor NM1 and the second N-channel metal oxide semiconductor transistor NM2. A source of the first P-channel metal oxide semiconductor transistor (hereinafter referred to as PMOS transistor) PM1 is connected to a power source voltage. A gate of the PM1 is connected to the first bias voltage VB1, and a drain of the PM1 is connected to an input terminal of the trans-impedance amplifier. A source of the second PMOS transistor PM2 is connected to the input terminal of the trans-impedance amplifier. A gate of the PM2 is connected to a drain of the fifth PMOS transistor PM5, and a drain of the PM2 is connected to an output terminal of the trans-impedance amplifier. A source of the fifth PMOS transistor PM5 is connected to the input terminal of the trans-impedance amplifier, and a gate of the PM5 is connected to the drain of the PM5. A source of the third PMOS transistor PM3 is connected to the input terminal of the trans-impedance amplifier. A gate of the PM3 is connected to the second bias voltage VB2, and a drain of the PM3 is connected to a drain of the first N-channel metal oxide semiconductor transistor (hereinafter referred to as NMOS transistor) NM1. A gate of the NM1 is connected to the third bias voltage VB3, and a source of the NM1 is grounded. A gate of the second NMOS transistor NM2 is connected to the drain of the NM1, a drain of the NM2 is connected to the drain of the PM5, and a source of the NM2 is grounded. The anode of the first resistor R1 is connected to the output terminal of the trans-impedance amplifier, and the cathode of the R1 is grounded. A source of the fourth PMOS transistor PM4 is connected to the power source voltage. A gate of the PM4 is connected to the first bias voltage VB1, and a drain of the PM4 is connected to the drain of the PM5.

FIG. 2 is a curve graph showing that an input impedance and a loop gain of the trans-impedance amplifier vary with frequency according to the present invention, wherein the solid line denotes the input impedance, and the dashed line denotes the loop gain. It can be seen from the FIG. 2 that the input impedance of the circuit is less than 10 ohms at the condition of less 30 MHz and less than 100 ohms at the condition of 100 MHz, which can fully absorb the input current of a relatively high bandwidth. The loop gain of the transconductance enhancement circuit is 45 dB at a low frequency, and the bandwidth of the transconductance enhancement circuit at 3 dB is higher than 10 MHz.

It should be noted that the above embodiments are not intended to limit the scope of protection of the present invention, and equivalent transformations or substitutions made based on the above technical solutions shall fall within the scope of protection of the claims of the present invention.

What is claimed is:

1. A wide voltage trans-impedance amplifier, comprising a first P-channel metal oxide semiconductor (PMOS) transistor, a second PMOS transistor, a third PMOS transistor, a fourth PMOS transistor, a fifth PMOS transistor, a first bias voltage, a second bias voltage, a third bias voltage, a first N-channel metal oxide semiconductor (NMOS) transistor, and a second NMOS transistor; wherein, a source of the first PMOS transistor is connected to a power source voltage, a gate of the first PMOS transistor is connected to the first bias voltage, and a drain of the first PMOS transistor is connected to an input terminal of the wide voltage trans-impedance amplifier; a source of the second PMOS transistor is connected to the input terminal of the wide voltage trans-impedance amplifier, a gate of the second PMOS transistor is connected to a drain of the fifth PMOS transistor, and a drain of the second PMOS transistor is connected to an output terminal of the wide voltage trans-impedance amplifier; a source of the fifth PMOS transistor is connected to the input terminal of the wide voltage trans-impedance amplifier, and a gate of the fifth PMOS transistor is connected to the drain of the fifth PMOS transistor; a source of the third PMOS transistor is connected to the input terminal of the wide voltage trans-impedance amplifier, a gate of the third PMOS transistor is connected to the second bias voltage, and a drain of the third PMOS transistor is connected to a drain of the first NMOS transistor; a gate of the first NMOS transistor is connected to the third bias voltage, and a source of the first NMOS transistor is grounded; a gate of the second NMOS transistor is connected to the drain of the first NMOS transistor, a drain of the second NMOS transistor is connected to the drain of the fifth PMOS transistor, and a source of the second NMOS transistor is grounded; an anode of the first resistor his connected to the output terminal of the wide voltage trans-impedance amplifier, and a cathode of the first resistor is grounded; a source of the fourth PMOS transistor is connected to the power source voltage, a gate of the fourth PMOS transistor is connected to the first bias voltage, and a drain of the fourth PMOS transistor is connected to the drain of the fifth PMOS transistor.

2. The wide voltage trans-impedance amplifier according to claim 1, wherein a common-gate amplifier detects a change of an input voltage, and a negative feedback is constructed by injecting a current into a current mirror to achieve a low input impedance.

* * * * *